United States Patent
Van Bommel et al.

(10) Patent No.: US 10,244,601 B2
(45) Date of Patent: Mar. 26, 2019

(54) SWITCHABLE HIGH COLOR CONTRAST LIGHTING

(71) Applicant: PHILIPS LIGHTING HOLDING B.V., Eindhoven (NL)

(72) Inventors: Ties Van Bommel, Eindhoven (NL); Dirk Jan Van Kaathoven, Eindhoven (NL); Rifat Ata Mustafa Hikmet, Eindhoven (NL); Rick Gerhardus Nijkamp, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 15/575,921

(22) PCT Filed: May 11, 2016

(86) PCT No.: PCT/EP2016/060587
§ 371 (c)(1),
(2) Date: Nov. 21, 2017

(87) PCT Pub. No.: WO2016/188755
PCT Pub. Date: Dec. 1, 2016

(65) Prior Publication Data
US 2018/0153016 A1    May 31, 2018

(30) Foreign Application Priority Data
May 26, 2015 (EP) .................... 15169114

(51) Int. Cl.
*H05B 33/08*    (2006.01)
*H01L 33/50*    (2010.01)
(Continued)

(52) U.S. Cl.
CPC ....... *H05B 33/0863* (2013.01); *H01L 33/502* (2013.01); *H05B 33/0845* (2013.01);
(Continued)

(58) Field of Classification Search
None
See application file for complete search history.

(56) References Cited

U.S. PATENT DOCUMENTS

| 7,902,560 B2 | 3/2011 | Bierhuizen et al. |
| 8,247,959 B2 | 8/2012 | Beers et al. |
| (Continued) | | |

FOREIGN PATENT DOCUMENTS

| WO | WO2005115059 A1 | 12/2005 |
| WO | WO2013150455 A1 | 10/2013 |
| WO | WO2015014936 A1 | 2/2015 |

*Primary Examiner* — Douglas W Owens
*Assistant Examiner* — Jianzi Chen

(57) ABSTRACT

The invention provides a lighting unit (10) comprising a first lighting device (100), a second lighting device (200), and a control unit (300) configured to control the lighting devices (100,200), wherein (a) the first lighting device (100) is configured to provide first lighting device light (101) having a first spectral distribution with at least two first emission maxima (EM11, EM12, . . . ) spaced by at least 75 nm, a first color point x1,y1 and a first correlated color temperature T1; (b) the second lighting device (200) is configured to provide second lighting device light (201) having a second spectral distribution with at least two emission maxima (EM21, EM22, . . . ) spaced by at least 75 nm, a second color point x2,y2 and a second correlated color temperature T2; (c) the lighting unit (10) is configured to generate lighting unit light (11) comprising one or more of the first lighting device light (101) and the second lighting device light (201); and (d) the first spectral distribution and the second spectral distribution are different with at least one first emission maxima (EM11) and at least two second emission maxima (EM21,EM22) mutually differing at least 10 nm from each other, and wherein one or more of (i) $0.9 \le x1/x2 \le 1.1$, (ii) $0.9 \le y1/y2 \le 1.1$, and (iii) $0.9 \le T1/T2 \le 1.1$ applies.

14 Claims, 9 Drawing Sheets

(51) Int. Cl.
 *H05B 37/02* (2006.01)
 *H01L 25/075* (2006.01)
(52) U.S. Cl.
 CPC ..... *H05B 33/0857* (2013.01); *H05B 33/0872* (2013.01); *H05B 37/0218* (2013.01); *H01L 25/0753* (2013.01); *H01L 2933/0083* (2013.01)

(56) References Cited

U.S. PATENT DOCUMENTS

| | | |
|---|---|---|
| 8,791,642 B2 | 7/2014 | van de Ven et al. |
| 2009/0122530 A1 | 5/2009 | Beers et al. |
| 2012/0099303 A1 | 4/2012 | Li et al. |
| 2012/0162979 A1 | 6/2012 | Ng et al. |
| 2016/0169459 A1* | 6/2016 | Van Bommel ...... F21V 23/0457 362/84 |

* cited by examiner

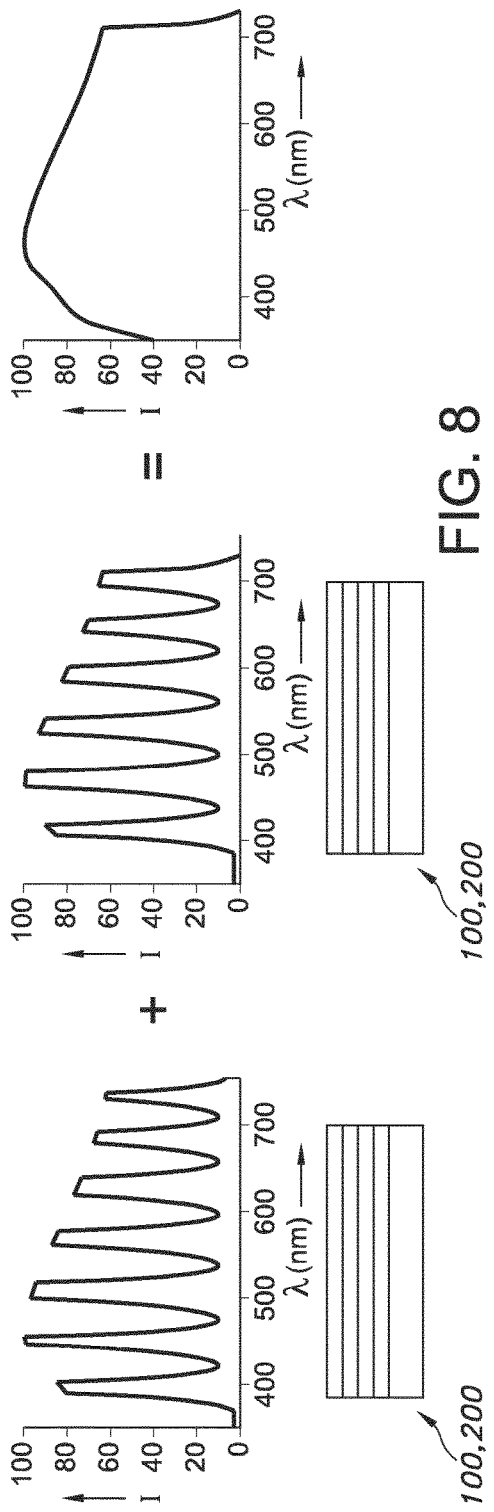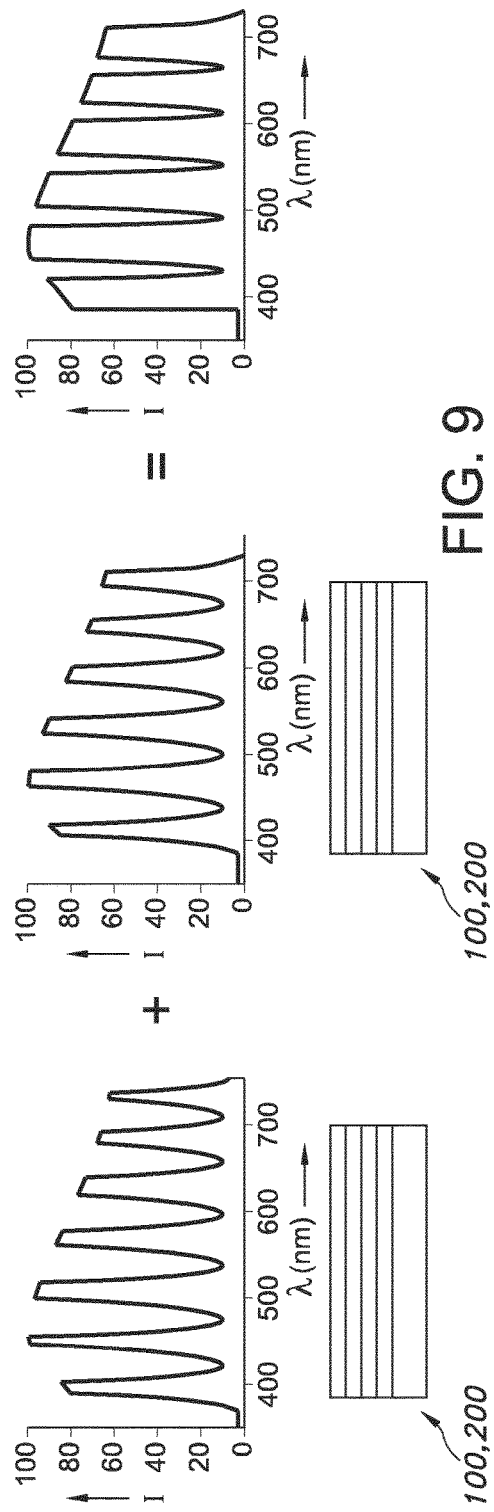
FIG. 8
FIG. 9

SWITCHABLE HIGH COLOR CONTRAST LIGHTING

CROSS-REFERENCE TO PRIOR APPLICATIONS

This application is the U.S. National Phase application under 35 U.S.C. § 371 of International Application No. PCT/EP2016/060587, filed on May 11, 2016, which claims the benefit of European Patent Application No. 15169114.4, filed on May 26, 2015. These applications are hereby incorporated by reference herein.

FIELD OF THE INVENTION

The invention relates to a lighting unit as well as to a method of controlling color contrast with such lighting unit.

BACKGROUND OF THE INVENTION

The issue of contrasts of colors of an object when such object is illuminated with light is known in the art. US2009122530, for instance, describes solid state illumination systems which provide improved color quality and/or color contrast. The systems provide total light having delta chroma values for each of the fifteen color samples of the color quality scale that are preselected to provide enhanced color contrast relative to an incandescent or blackbody light source, in accordance with specified values which depend on color temperature. Illumination systems provided in US2009122530 comprise one or more organic electroluminescent elements, or these comprise a plurality of inorganic light emitting diodes, wherein at least two inorganic light emitting diodes have different color emission bands.

WO2005/115059 describes a white light emitting element having a spectrum in a wide wavelength range. WO2005/115059 desires to provide a white light emitting element in which chromaticity of white color is hard to change over time. Further, WO2005/115059 desires to provide a white light emitting element in which the shape of an emission spectrum does not tend to depend on current density. A first light emitting element and a second light emitting element are serially laminated over a substrate. The first light emitting element has a light emitting layer between a first anode and a first cathode, and the second light emitting element has a light emitting layer between a second anode and a second cathode. The light emitting layer shows a first emission spectrum having peaks both in a blue to blue green wavelength range and in a yellow to orange wavelength range, and the light emitting layer shows a second emission spectrum having peaks both in a blue green to green wavelength range and in an orange to red wavelength range.

This document provides an example of a light emitting element in which a first light emitting element and a second light emitting element are laminated in series over a substrate. The second light emitting element has a light emitting layer between a second anode and a second cathode. The light emitting layer of the first light emitting element includes a first light emitting layer showing an emission spectrum having a peak in a blue to blue green wavelength range and a second light emitting layer showing an emission spectrum having a peak in a yellow to orange wavelength range. The light emitting layer of the second light emitting element includes a third light emitting layer showing an emission spectrum having a peak in a blue green to green wavelength range and a fourth light emitting layer showing an emission spectrum having a peak in an orange to red wavelength range. Note that the order of lamination of the first light emitting layer and the second light emitting layer may be the reverse. The order of lamination of the third light emitting layer and the fourth light emitting layer may be the reverse. When a positive bias is applied to the first anode side and a negative bias is applied to the second cathode side of the light emitting element, first light and second light can be provided. The first light is a combination of both light emitted from the first light emitting layer and the second light emitting layer; thus, it shows an emission spectrum having peaks both in a blue to blue green wavelength range and in a yellow to orange wavelength range. In other words, the first light is dual wavelength white or near-white emission color. The second light is a combination of both light emitted from the third light emitting layer and the fourth light emitting layer; thus, it shows an emission spectrum having peaks both in a blue green to green wavelength range and in an orange to red wavelength range. In other words, the second light emitting element shows dual wavelength white or near-white emission color which is different from that of the first light emitting element. Thus, the light emitting element of the invention can provide light which covers a blue to blue green wavelength range, a blue green to green wavelength range, a yellow to orange wavelength range, and an orange to red wavelength range as a result of overlapping the first light with the second light. The first light emitting element and the second light emitting element each have a similar structure to that of a dual wavelength white light emitting element using a complementary color relationship which is often conventionally used, and can realize a white or near-white light emitting element having high luminance and favorable element life. However, the first light emitting element shows a poor spectrum mainly in a blue green to green (specifically, emerald green) wavelength range and in an orange to red wavelength range, and is not suitable for a full color display using a color filter. In addition, the first light emitting element has a narrow spectrum in an emerald green wavelength range and lacks in vividness.

SUMMARY OF THE INVENTION

High color contrast (i.e. good color discrimination) is desirable, such as in the case of color blindness, for surgical applications (e.g. to better recognize different tissues or organs, etc.), for graphical applications (e.g. to check the quality of the printed material, etc.) and for educational lighting (e.g. to improve visibility of pictures/graphs etc. in e.g. study books, etc.). In these applications it appears that a peaked spectrum is desired. At the same time for general lighting applications, such as spot lighting, it appears that a full spectrum is desired. For this purpose, it is possible to use large number of narrow emitters and control these individually in order to obtain the desired spectrum. However, making such a light source is rather complicated and expensive.

Hence, it is an aspect of the invention to provide an alternative lighting unit and/or an alternative method for controlling color contrast (with a lighting unit), which preferably further at least partly obviate one or more of above-described drawbacks.

Herein, it is especially suggested to use a white light device emitting a substantially full spectrum at a given correlated color temperature (CCT) and/or color renderings index (CRI) and superimpose a peaked light emission spectrum which has substantially the same correlated color temperature and/or CRI. By changing the relative intensities of the light sources it surprisingly appears that one can control the degree of color contrast and aid thereby lighting in e.g. the above-mentioned applications but also provide light that can be used for general lighting purposes. Further, the present solution does not need complicated control systems for a plurality of light sources (though if desired, the respective lighting devices (see below) may include a plurality of different (direct) LEDs having different LED emission colors; e.g. color mixed (CM) LEDs).

Hence, in a first aspect the invention provides a lighting unit comprising a first lighting device, a second lighting device, and (optionally) a control unit configured to control the lighting devices, wherein the first lighting device is configured to provide first lighting device light having a first spectral distribution, a first color point, indicated as x1,y1, and a first correlated color temperature, indicated as T1. The second lighting device is configured to provide second lighting device light having a second spectral distribution, a second color point, indicated as x2,y2, and a second correlated color temperature, indicated as T2. The lighting unit is configured to generate lighting unit light comprising one or more of the first lighting device light and the second lighting device light wherein the first spectral distribution and the second spectral distribution are different, and wherein one or more of (i) $0.85 \leq x1/x2 \leq 1.15$, especially $0.9 \leq x1/x2 \leq 1.1$, (ii) $0.85 \leq y1/y2 \leq 1.15$, especially $0.9 \leq y1/y2 \leq 1.1$, and (iii) $0.7 \leq T1/T2 \leq 1.3$, especially $0.9 \leq T1/T2 \leq 1.1$, applies.

Further, the invention provides in a next aspect a method of controlling color contrast (of an object) provided by lighting unit light from the lighting unit as defined herein, wherein the method comprises controlling the intensity of the first lighting device light and second lighting device light (illuminating the object). Further, the invention also provides a method of illuminating an object comprising illuminating the object with lighting unit light from the lighting unit as defined herein, and controlling the intensity of the first lighting device light and second lighting device light. Thereby, color contrast of the object may be controlled, e.g. in dependence of the lighting conditions in a space (i.e. light provided by other light sources, including the sun) and/or in dependence of setting provided by a user, etc. The term "object" may also refer to a plurality of objects, which may optionally be different objects. Hence, color contrast of different objects may also be enhanced with the present method(s) and lighting unit.

As indicated above, the lighting unit and/or lighting method may especially be used for enhancing color contrast, for graphical industry lighting, for printing industry lighting, for operating room lighting, or for educational lighting, etc. However, the lighting unit and/or lighting method may (thus) also be used for general lighting purposes, or for other purposes. However, when desired, the light can be tuned to enhance color contrast.

As indicated above, the lighting unit comprises a first lighting device, a second lighting device, and (optionally) a control unit configured to control the lighting devices. The lighting unit is configured to generate lighting unit light comprising one or more of the first lighting device light and the second lighting device light. The lighting unit may be configured to provide e.g. a single light beam comprising one or more of the first lighting device light and the second lighting device light. To this end, the lighting unit may comprise a light exit face, from which the lighting unit light may escape from the unit (as a single light beam). However, the lighting unit may also be configured to provide e.g. a plurality of light beams, each comprising one or more of the first lighting device light and the second lighting device light. To this end, the lighting unit may comprise a plurality of light exit faces, from which the lighting unit light may escape from the unit (as a plurality of light beams).

The lighting unit may also be integrated in a lighting system, comprising one or more of such lighting units and optionally one or more other lighting units, and especially also including a control unit (see further also below).

The first lighting device is configured to provide first lighting device light having a first spectral distribution, a first color point indicated as x1,y1 and a first correlated color temperature indicated as T1. Hence, the first lighting device is especially configured to provide white light, e.g. having a correlated color temperature in the range between 2000K and 20000K, even more especially in the range of 2000K to 10000K, such as in the range of 2000 K to 6000K. The first lighting device may comprise in an embodiment a single solid state light source comprising a plurality of different luminescent materials, such as pc-LEDs (luminescent material converted LEDs). Alternatively or additionally, the first lighting device may comprise in an embodiment a plurality of different solid state light sources, especially thus without luminescent materials. Especially however, when the first lighting device comprises a plurality of light sources, such as a plurality of solid state light sources, these sources are controlled as a bank, i.e. increasing or decreasing the intensity of the light source is reflected (directly) in the intensity of the light provided by the plurality of light sources. This minimizes electronics and (thus) costs.

Likewise, the second lighting device is configured to provide second lighting device light having a second spectral distribution, a second color point indicated as x2,y2 and a second correlated color temperature indicated as T2. Hence, the second lighting device is especially configured to provide white light, e.g. having a correlated color temperature in the range of 2000K to 20000K, such as especially in the range of 2000K to 6000K. The second lighting device may comprise in an embodiment a single solid state light source comprising a plurality of different luminescent materials, such as pc-LEDs (luminescent material converted LEDs). Alternatively or additionally, the second lighting device may comprise in an embodiment a plurality of different solid state light sources, especially thus without luminescent materials. Especially however, when the second lighting device comprises a plurality of light sources, such as a plurality of solid state light sources, these sources are controlled as a bank, i.e. increasing or decreasing the intensity of the light source is reflected (directly) in the intensity of the light provided by the plurality of light sources. This minimizes electronics and (thus) costs.

Each spectral distribution has an accompanying color point x, y (CIE coordinates (especially CIE 1931 color space chromaticity)). These are herein indicated as x1,y1 for the first spectral distribution and as x2,y2 for the second spectral distribution.

Hence, the first lighting device and the second lighting device may each independently comprise a solid state LED light source (such as a LED or laser diode). The term "light source" may also relate to a plurality of light sources, such as 2 to 20 (solid state) LED light sources. Hence, the term LED may also refer to a plurality of LEDs.

The term white light herein, is known to the person skilled in the art. It especially relates to light having a correlated color temperature (CCT) between about 2000K and 20000K, especially 2700K-20000K, for general lighting especially in the range of about 2700K to 6500K, and especially within about 15 SDCM (standard deviation of color matching) from the BBL (black body locus), especially within about 10 SDCM from the BBL, even more especially within about 5 SDCM from the BBL. Hence, especially the first spectral light distribution and the second spectral light distribution are within about 15 SDCM from each other, especially within about 10 SDCM, even more especially within about 5 SDCM.

Further, the first spectral distribution has a first emission maximum (in the visible), especially at least two first emission maxima (here "first" refers to the first spectral distribution). Further, the second spectral distribution has especially at least two second emission maxima, especially at least three, such as at least four second emission maxima (in the visible) (here "second" refers to the second spectral distribution). The at least three, or at least four emission maxima (of these two spectral distributions) all mutually differ especially at least 10 nm, such as at least 15 nm even more especially at least 20 nm, such as especially at least 30 nm, such as in the range of 15 nm to 100 nm. Hence, in an embodiment the spectral distributions are e.g. different in the number of emission maxima, but especially at least different in the position of emission maxima and/or spectral bandwidths of the emissions. Therefore, in an embodiment the first spectral distribution and the second spectral distribution are different with the emission maxima at least a first emission maximum and at least two second emission maxima (further also indicated as "EM11, EM21, EM22") (all) mutually differing at least 10 nm from each other. Note that the two second emission maxima by definition may differ at least 10 nm, as they may especially be defined to differ at least 75 nm (see also below). However, these two emission maxima differ in position also at least 10 nm with a first emission maximum of the first spectral distribution. Note that when there are e.g. more than one (first) emission maximum in the first spectral distribution and/or more than two (second) emission maxima in the second spectral distribution all may mutually differ, but this may not be necessary when at least at least one emission maximum of the first spectral distribution and at least two emission maxima of the second spectral distribution all mutually differ.

Note that the phrase "the first spectral distribution and the second spectral distribution are different with the emission maxima at least a first emission maximum and at least two second emission maxima (further also indicated as "EM11, EM21, EM22") (all) mutually differing at least 10 nm from each other" may equally be defined as "second spectral distribution and the first spectral distribution are different with the emission maxima at least a second emission maximum and at least two first emission maxima (further also indicated as "EM21, EM11, EM12") (all) mutually differing at least 10 nm from each other".

In a specific embodiment, the first spectral distribution has at least a first emission maximum, wherein the second spectral distribution has at least three second emission maxima spaced by at least 50 nm, with the first emission maximum and at least two second emission maxima (of the at least three second emission maxima), even more especially at least three second emission maxima (of the at least three second emission maxima), all mutually differing at least 10 nm from each other.

In yet another specific embodiment, the first spectral distribution has at least two first emission maxima spaced by at least 50 nm, such as at least 75 nm, wherein the second spectral distribution has at least two second emission maxima spaced by at least 50 nm, such as by at least 75 nm, with at least two first emission maxima (of the at least two first emission maxima) and at least two second emission maxima (of the at least two second emission maxima) all mutually differing at least 10 nm from each other.

Hence, as indicated above, the first spectral distribution and the second spectral distribution are different. Especially, this may be obtained in two types of embodiments, though more options are possible than these two types of embodiments. These two main embodiments, and some others, are described below.

In a first main embodiment, one of the lighting devices provides a broad band emission spectrum, substantially having intensity in the entire visible. The terms "visible", "visible light" or "visible emission" refer to light having a wavelength in the range of about 380 nm to 780 nm. For instance, such lighting device may provide a broad band, or two to three broad bands covering a substantial part of the visible spectrum, such as one or more bands having full width half maximums (FWHMs) in the range of 75 nm or larger, such as 100 nm or larger. Especially, in an embodiment at least one of the lighting devices is configured to provide lighting device light having a spectral distribution with one or more emission bands having a full width half maximum (FWHM) of at least 75 nm, such as especially at least 100 nm. Examples of such broad band emitters include e.g. $Eu^{2+}$ and $Ce^{3+}$. Especially $Ce^{3+}$ in a garnet system may be suitable for such applications. Of course, this implies pumping with excitation light, but this is further described below. Especially, the second lighting device then comprises a plurality of more narrow bands. In this way, the lighting unit can switch between two different types of spectra, especially also including combinations of these spectra in various intensity ratios, by which contrast may be enhanced and/or by which high contrast light may be exchanged for general light.

The above variant, wherein one or more bands having full width half maximums (FWHMs) in the range of 75 nm or larger are applied, is not restricted to this main embodiment, but may also be applied in other embodiments.

The other main embodiment is an embodiment wherein the two spectra or spectral distributions of the first lighting device light and second lighting device light provide a spectral light distribution covering a substantial part of the visible spectrum. In this embodiment, and variants thereon, the spectral light distributions may include more narrow bands, or even lines (see also below). Further, especially the spectral light distributions of the first lighting device light and second lighting device light may then especially substantially be supplementary, i.e. a low spectral overlap between the two spectral distributions. Hence, in a specific embodiment the first spectral distribution and the second spectral distribution have a spectral overlap (O) equal to or smaller than 70%, such as especially below 50%, like even more especially below 30%. The spectral overlap can be evaluated by calculating the overlap of normalized first spectral distribution in the visible range with the normalized second spectral distribution in the visible range. The spectral overlap can also be evaluated by calculating the overlap of normalized second spectral distribution in the visible range with the normalized first spectral distribution in the visible range. The larger value of the spectral overlap is especially below one or more of the above indicated values.

Even though the spectral distributions are different, the first lighting device and the second lighting device provide lighting device light that is substantially identical in color point and/or correlated color temperature. Hence, the first lighting device and the second lighting device are especially configured to provide white lighting device light. Hence, when referring to the color point (CIE coordinates), the x-value or the y-value may substantially be identical. When referring to the correlated color temperatures, especially the correlated color temperature (CCT), these may (also) substantially be identical. Hence, in a specific embodiment one or more of (i) 0.85≤x1/x2≤1.15, (ii) 0.85≤y1/y2≤1.15, and (iii) 0.7≤T1/T2≤1.3 applies, even more especially one or more of (i) 0.9≤x1/x2≤1.1, (ii) 0.9≤y1/y2≤1.1, and (iii) 0.8≤T1/T2≤1.2 applies, yet even more especially one or more of (i) 0.95≤x1/x2≤1.05, (ii) 0.95≤y1/y2≤1.05, and (iii) 0.9≤T1/T2≤1.1 applies, such as 0.95≤T1/T2≤1.05.

In yet a further specific embodiment, the first lighting device is configured to provide first lighting device light having a first color rendering index indicated by CRI1 and wherein the second lighting device is configured to provide second lighting device light having a second color rendering index indicated by CRI2, wherein 0.8≤CRI1/CRI2≤1.2, especially 0.9≤CRI1/CRI2≤1.1, applies. This may improve the perception that the lighting unit light is substantially identical in color, but nevertheless may be tuned to different color contrast, dependent on e.g. an object that is illuminated by the lighting unit and the relative intensities of the different lighting device light.

In embodiments, the first lighting device light has a smaller number of first emission maxima than the second lighting device light.

The first lighting device and/or the second lighting device may both independently comprise one or more solid state light sources of which the solid state light source light is directly used, or is partly converted, or is substantially completely converted. Also combinations of a plurality of these principles may be used in the first lighting device and/or the second lighting device.

In a specific embodiment, at least one of the lighting devices is configured to provide lighting device light having a spectral distribution with one or more emission bands having a full width half maximum (FWHM) of at least 15 nm, such as at least 30 nm, such as up to e.g. about 100 nm, or up to about 75 nm (see however also below). For instance, this may be obtained with a direct LEDs, i.e. LEDs are used of which the solid state light source light is used as contribution to the lighting device light, without further conversion. However, alternatively or additionally luminescent material converted LEDs may be used, wherein e.g. quantum dots are applied. Especially quantum dots may be used to provide visible light with band which is much broader than line emission, but nevertheless relatively small compared to e.g. $Ce^{3+}$ emission in garnets. Hence, e.g. quantum dots may especially be used to design spectral distribution of a plurality of bands. Hence, in an embodiment one or more of the lighting devices comprise luminescent quantum dots.

In yet a further specific embodiment, at least one of the lighting devices (is configured to provide lighting device light having a spectral distribution with three or more emission bands having a full width half maximum (FWHM) of at least 30 nm and at maximum 100 nm, such as at maximum 75 nm, such as at maximum 50 nm. For instance, this may be achieved with quantum dots or line emitters. Especially, only one of the lighting devices is configured to provide lighting device light having a spectral distribution with three or more emission bands having a full width half maximum (FWHM) of at least 15 nm, such as especially at least 30 nm and at maximum 100 nm, such as at maximum 50 nm. The other one may be configured to provide lighting device light with a spectral distribution with one or more emission bands having FWHMs of at least 75 nm, such as even at least 100 nm. Hence, this may provide a peak spectral distribution and a broad band spectral distribution for the respective lighting devices.

Especially when using luminescent material converted LEDs also line emitting lanthanides or transition metals may be applied. By e.g. combining a plurality of such emitting species, also a white emitting lighting device may be created. Note that of course also a combination of one or more line emitters and one or more band emitters may be applied. Herein, a line emitter is especially defined as a species that emits emission at liquid helium temperature having a bandwidth of a single electronic transition smaller than 15 nm. For instance, intra 4f transitions always have bandwidth smaller than about 15 nm. The fact that prior art spectra sometimes seem to have a broader line width is often due to the fact that the spectral resolution of the measuring device is too low and/or spectrally not resolved multiplets are measured and/or the spectra are measured at room temperature. Hence, the term "line emitter" especially refers to those emitting species that provide electronic intra shell electronic transitions, such as some d-d transitions of transition metals. Often, these transitions are parity and spin forbidden, as known to the person skilled in the art.

Hence, in an embodiment one or more of the lighting devices comprise one or more line emitters. Especially, in such embodiment at least one of the lighting devices also comprises one or more band emitters.

To provide a good spectral distribution in terms of color rendering, one may need at least two maxima for at least one of the lighting devices, such as at least one of the lighting devices providing lighting device light comprising maxima in the blue and yellow, or at least one of the lighting devices providing lighting device light comprising maxima in the blue, green and red. Hence, in embodiments at least one of the lighting devices is configured to provide lighting device light having a spectral distribution with at least three emission maxima spaced by at least 50 nm, such as at least 75 nm, like at least 100 nm, such as even at least 150 nm. The term emission maximum may refer to the maximum of a band, such as of an emission band of a quantum dot, of a(nother) (broad) band emitter, of a solid state light source, etc. and may also refer to the maximum of a line emission. The phrase "at least three emission maxima spaced by at least 50 nm" and similar phrases do not exclude the availability of further emission maxima. In such spectrum with a plurality of emission maxima, there may be adjacent emission maxima located at shorter distances in the order of nanometers from each other, but there are at least three maxima spaced at at least 50 nm from each other, e.g. by way of example 450 nm, 550 nm, 610 nm and 650 nm.

In yet further specific embodiments the one or more line emitters are selected from the group consisting of luminescent materials comprising one or more selected from the group consisting of $Pr^{3+}$, $Sm^{3+}$, $Eu^{3+}$, $Tb^{3+}$, $Dy^{3+}$, $Ho^{3+}$, and $Tm^{3+}$, and wherein the one or more band emitters are selected from the group consisting of luminescent materials comprising one or more selected from the group consisting of $Eu^{2+}$, $Ce^{3+}$ and quantum dots. Note that some of the line emitters may also emit broad bands, depending upon the chemical surrounding of the line emitting element, and/or that some broad band emitters may also provide line emission, depending upon the chemical surrounding of the line emitting element.

In a specific embodiment at least one of the lighting devices is configured to provide lighting device light having a spectral distribution with one or more emission bands having a full width half maximum (FWHM) of at least 100 nm. For instance, YAG doped with $Ce^{3+}$ may provide such broad emission band. Especially, at least one of the lighting devices provides lighting device light comprising (broad) bands, such as provided by quantum dot light and/or by e.g. one or more of $Eu^{2+}$ and $Ce^{3+}$. It appears that for a wide tuning of the contrast it is beneficial when one of the lighting devices provides a relative broad band spectral distribution, whereas the other lighting device provides a spectral distribution comprising one or more of relatively narrow bands and line emission(s).

In a specific embodiment, one of the lighting devices is configured to provide lighting device light having a spectral distribution with one or more emission bands having a full width half maximum (FWHM) of at least 75 nm, such as even at least 100 nm and wherein the other one of the lighting devices is configured to provide lighting device light having a spectral distribution with at least three emission maxima spaced by at least 50 nm, such as at least 75 nm, like at least 100 nm, such as even at least 150 nm. An example thereof is e.g. a first lighting device comprising a blue LED and a cerium containing garnet, optionally supplemented with a red component, and a second lighting device comprising a blue LED with quantum dots and/or line emitters. Therefore, in a specific embodiment one of the lighting devices is configured to provide lighting device light having a spectral distribution with three or less emission maxima and the other one of the lighting devices is configured to provide lighting device light having a spectral distribution with at least four emission maxima spaced by at least 50 nm, such as especially at least 75 nm.

One of the spectral distributions may comprise only a single emission maximum. In an embodiment, one of the spectral distributions may comprise a single emission maximum at the edge of the visible, such as close or at 780 nm. This may especially be the case with relatively low color temperature applications, such as below about 4500K, such as especially below 4000K, see e.g. WO2013150455, which is incorporated herein by reference.

Quantum dots may be provided as bare particles, or may e.g. be provided as core-shell particles. The term "shell" may also refer to a plurality of shells. Further, core-shell particles are not necessarily spherical; they may e.g. also be of the quantum rod type or tetrapod type (or other multipod type), etc. Further examples are provided below. The bare particle or core is the optically active part. The shell is used as a kind of protection and often comprises a similar type of material, such as a ZnSe core and a ZnS shell (see also below). Such particles are commercially available in organic liquids, with organic ligands attached to such particles for better dispersion. Herein, the outer layer of the particle is the layer most remote from a central part of the bare particle or the core. In the case of a ZnS shell, this outer layer would be the ZnS surface of the QD. The invention is, however, not limited to quantum dots whit a ZnS shell and a ZnSe core. Below, a number of alternative quantum dots are described. Hence, the term "quantum dot" may amongst others refer to core-shell particles, to substantially spherical particles comprising optionally a shell surrounding a core, to quantum rod type or tetrapod type (or other multipod type), etc.

In an embodiment, the surrounding "shell" material can have a band gap greater than the band gap of the core material. In certain other embodiments, the surrounding shell material can have a band gap less than the band gap of the core material. In an embodiment, the shell can be chosen so as to have an atomic spacing close to that of the "core" substrate. In certain other embodiments, the shell and core materials can have the same crystal structure. Examples of semiconductor nanocrystal (core)shell materials include, without limitation: red (e.g., (CdSe)ZnS (core)shell), green (e.g., (CdZnSe)CdZnS (core)shell, etc.), and blue (e.g., (CdS)CdZnS (core)shell (see further also above for examples of specific wavelength converter nanoparticles, based on semiconductors. Herein, the terms "semiconductor nanocrystal" and "QD" are used interchangeably. Another term for quantum dots is luminescent nanocrystal. Hence, the above-mentioned outer surface may be the surface of a bare quantum dot (i.e. a QD not comprising a further shell or coating) or may be the surface of a coated quantum dot, such as a core-shell quantum dot (like core-shell or dot-in-rod), i.e. the (outer) surface of the shell. Therefore, in a specific embodiment, the wavelength converter nanoparticles are selected from the group consisting of core-shell nano particles, with the cores and shells comprising one or more of CdS, CdSe, CdTe, ZnS, ZnSe, ZnTe, HgS, HgSe, HgTe, CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, AlNAs, AlPAs, InNP, InNAs, InPAs, GaAlNP, GaAlNAs, GaAlPAs, GaInNP, GaInNAs, HgZnSTe, GaN, GaP, GaAs, AlN, AlP, AlAs, InN, InP, InAs, GaNP, GaNAs, GaPAs, AlNP, AlNas, AlPAs, InNP, InNAs, InPAs, GaAlNP, GaAlNAs, GaAlPAs, GaInNP, GaInNAs, GaInPAs, InAlNP, InAlNAs, and InAlPAs. In general, the cores and shells comprise the same class of material, but essentially consist of different materials, like a ZnS shell surrounding a CdSe core, etc. In an embodiment, the quantum dots comprise core/shell luminescent nanocrystals comprising CdSe/ZnS, InP/ZnS, PbSe/PbS, CdSe/CdS, CdTe/CdS or CdTe/ZnS.

Of course, the quantum dots and/or line emitters may be embedded in a material (host matrix), such as polymeric material, ceramic material, oxide material, etc. This is known in the art.

In yet a further specific embodiment one or more of (i) $0.95 \leq x1/x2 \leq 1.05$, (ii) $0.95 \leq y1/y2 \leq 1.05$, and (iii) $0.95 \leq T1/T2 \leq 1.05$ applies. Hence, even though the spectral distribution may be very different, the relevant spectral properties color point and color temperature may substantially be identical.

Further, in yet a specific embodiment the first lighting device comprises (i) a first solid state light source configured to provide first solid state light source radiation and (ii) a first luminescent material configured to convert at least part of the first solid state light source radiation into first luminescent material light, wherein the first lighting device light comprises (especially substantially consists of) said first luminescent material light (especially when all solid state light source light is converted into luminescent material light) or (b) said first luminescent material light and said first solid state light source radiation.

Alternatively or additionally, the second lighting device comprises (i) a second solid state light source configured to provide second solid state light source radiation and (ii) a second luminescent material configured to convert at least part of the second solid state light source radiation into second luminescent material light, wherein the second lighting device light comprises (especially substantially consists of) said second luminescent material light (especially when all solid state light source light is converted into luminescent material light) or (b) said second luminescent material light and said second solid state light source radiation.

As indicated above, the lighting unit especially comprises also a control unit, especially configured to independently control the first lighting device and the second lighting device. In this way, the lighting unit can switch between lighting unit light comprising different contributions of the first lighting device light and the second lighting device light, e.g. in a smooth manner without stepping between different distinct levels. Further, the control unit may be configured to control the lighting devices as function of a sensor signal of e.g. a sensor configured to measure lighting conditions in a room. Dependent upon the lighting conditions, contrast may have to be increased or may be reduced. For instance, the control unit may be configured to control the lighting devices as function of one or more of the day time and the season, but also in dependence upon the presence of a person in a room, etc. Hence, in yet a further embodiment, the lighting unit may further comprise a sensor, wherein the control unit is especially configured to control the lighting devices as function of a sensor signal of the sensor. In this way, light settings may be adapted as function of the sensor signal. For instance, the sensor may be configured to sense ambient light in a room (wherein the lighting unit is configured to provide lighting unit light).

In yet a further embodiment the control unit is configured to provide the first lighting device light and/or second lighting device light in a pulsed manner, for instance at frequencies of at least 50 Hz. In yet another embodiment, the control unit is configured to provide the first lighting device and/or second lighting device light in a pulsed manner and to control the intensity of the first lighting device and/or second lighting device light during the respective pulses. In this way, color control may even be enhanced.

In an embodiment, the intensity of the first lighting device light and/or the second lighting device light may be controlled (by the control unit) via pulse-width modulation. Hence, amongst others the lighting unit light may be controlled by pulse-width modulation of the first lighting device light and/or the second lighting device light.

Further, especially the lighting unit may further comprise a user interface, wherein the control unit is configured to control an intensity of one or more of the first lighting device light and second lighting device light in dependence of an input parameter provided by the user interface. In this way, the user may define the desired setting. The user interface may be a hardware type user interface, e.g. physically integrated in the lighting device, and/or may be a software type user interface, such as an App (i.e. graphical user interface).

Hence, amongst others in the above indicated ways the lighting unit may generate lighting unit light comprising one or more of the first lighting device light and the second lighting device light.

Therefore, in embodiments the lighting may further comprises a sensor, wherein the control unit is especially configured to control the lighting devices, i.e. the lighting device light of the first lighting device and second lighting device, as function of a sensor signal of the sensor. Alternatively or additionally, the lighting unit may further comprise a user interface, wherein the control unit is configured to control the lighting devices, i.e. an intensity of one or more of the first lighting device light and second lighting device light in dependence of an input parameter provided by the user interface. Hence, especially the control unit is configured for controlling the intensity of the first lighting device light and second lighting device light. In this way, the control unit may control the lighting unit light. For instance, as function of the sensor signal and/or the input signal (from a user interface), the control unit may control the lighting unit light by controlling the intensity of the first lighting device light and second lighting device light.

Herein, the terms "first lighting device" and/or "second lighting device" may each independently refer to a plurality of first lighting devices and/or a plurality of second lighting devices. The lighting unit may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD backlighting. Hence, the invention also provides a lighting system comprising a plurality of lighting units as defined herein. These lighting units may be substantially identical or the lighting system may include two or more subsets, with each subset one or more lighting units, wherein the lighting units of different subsets differ. The lighting system especially comprises a control unit (see also above), configured to control the lighting units independently, or configured to control the subsets of lighting units independently. Hence, the lighting system especially includes a plurality of lighting units that are functionally coupled (such as via a control unit). As indicated above, the control unit may especially be configured for controlling the intensity of the first lighting device light and second lighting device light of each lighting unit. Alternatively, control unit may especially be configured for controlling the intensity of the first lighting device light of all lighting units and for controlling the intensity of the second lighting device light of all lighting units. In this way, the control unit may control the light generated by one or more lighting units of the lighting system. For instance, as function of a sensor signal and/or an input signal (from a user interface), the control unit may control the lighting unit light of one or more lighting units by controlling the intensity of the first lighting device light and second lighting device light of one or more lighting units.

Further, the lighting unit may comprise optionally also a third lighting device, or even further lighting devices. Such third lighting device or optionally one or more further lighting devices may differ from the first lighting device and the second lighting device. However, optionally one or more of such further lighting device(s) may also comply with the condition(s) indicated above with respect to the x-coordinate and/or the y-coordinate, and/or the correlated color temperature. Optionally, also one or more of such further lighting device(s) may also be configured as other type of lighting device.

Further, one or more of the first lighting device and/or the second lighting device may also be configured to provide colored light. For instance, one or both lighting devices may be configured to provide in a first mode white light and in a second mode colored light. Hence, during use modes can be chosen wherein the above indicated condition(s) apply, and wherein the contrast can be enhanced, when desired. However, e.g. the user may also indicate to provide colored light, with one or both lighting devices.

Hence, in a specific embodiment the invention provides a light emitting device for illuminating an object, the light emitting device comprising (i) a first light emitting element configured to emit first light, the first light having a first color point of white light; (ii) a second light emitting element configured to emit second light, the second light having a second color point of white light which is highly peaked, and (iii) a control device adapted for controlling the power supply of the first lighting device and the power supply of the second lighting device separately such as to provide white light of a third color point emitted by the light emitting device, wherein the first color point, second color point and third color point are (substantially) the same. In a further embodiment, the first light, second light, and combined first and second light have the same color rendering index.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 3,4,5, 6,7,8,9,10,11,12,13,14,15A-15B schematically depict some specific aspects and variants of amongst others the lighting devices, the luminescent materials, and configurations thereof.

Figure 1A:
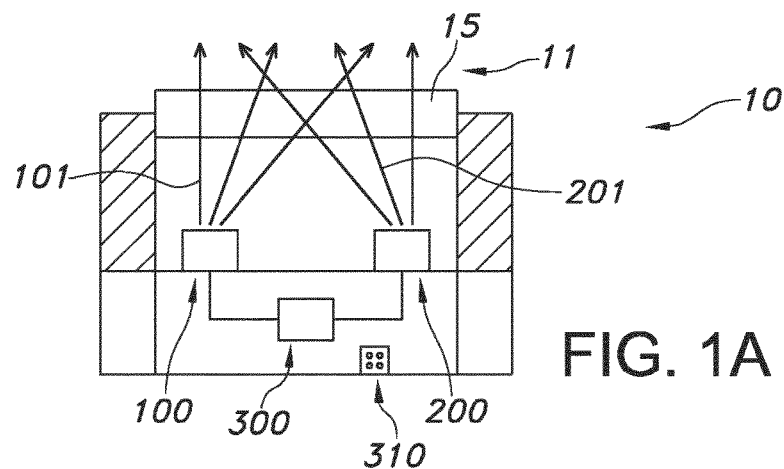
FIGS. 1A-1D schematically depict some embodiments and variants of the lighting device.

The drawings are not necessarily on scale.

DETAILED DESCRIPTION OF THE EMBODIMENTS

As indicated above, amongst others it is herein suggested to use a white light source emitting full spectrum at a given color temperature (CCT) and color rendering index (CRI) and superimpose peaked light emission which has the same color temperature and CRI. By changing the relative intensities of the light sources the degree of color contrast can be controlled. High color contrast (i.e. good color discrimination) is needed in several applications such as color blindness, surgical, graphical and educational lighting.

FIG. 1 schematically depicts a specific embodiment of a lighting unit 10. Here, the lighting unit 10 comprises a first lighting device 100, a second lighting device 200, and a control unit 300 configured to control the first and second lighting devices 100,200. The first lighting device 100 is configured to provide first lighting device light 101 having a first spectral distribution, a first color point x1,y1 and a first correlated color temperature T1. The second lighting device 200 is configured to provide second lighting device light 201 having a second spectral distribution, a second color point x2,y2 and a second correlated color temperature T2. The lighting unit 10 is configured to generate lighting unit light 11 comprising one or more of the first lighting device light 101 and the second lighting device light 201. Especially, the first spectral distribution and the second spectral distribution are different (see further also below), and wherein especially one or more of (i) $0.9 \leq x1/x2 \leq 1.1$, (ii) $0.9 \leq y1/y2 \leq 1.1$, and (iii) $0.9 \leq T1/T2 \leq 1.1$ applies. Dependent upon e.g. the desire of a user, the ratio of the first lighting device light 101 and the second lighting device light 201 may be varied. For instance, the lighting unit may further comprise a user interface 310 for setting parameters of the lighting unit. An exit window 15 is configured to receive lighting device light of both lighting devices 100,200. Hence, in general there are no separate exit windows for the different lighting devices. The exit window 15, such as a glass, quartz, ceramic, or polymeric window, is thus especially shared by the two (or more) lighting devices, and is configured to transmit at least part of the first and/or second lighting device light 101,201. Hence, upstream from the (light) exit window 15 the lighting devices 100,200 are configured. The terms "upstream" and "downstream" relate to an arrangement of items or features relative to the propagation of the light from a light generating means (here the especially the first light source), wherein relative to a first position within a beam of light from the light generating means, a second position in the beam of light closer to the light generating means is "upstream", and a third position within the beam of light further away from the light generating means is "downstream". The light exit window 15 thus comprises a light transmissive material, such as especially glass, quartz, a light transmissive polymer, a ceramic, etc.

Figure 1B:
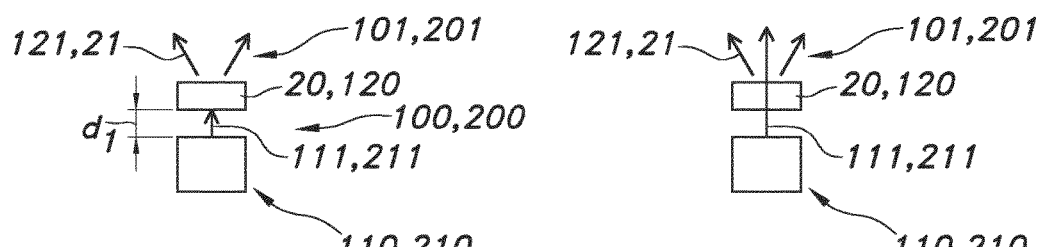

FIG. 1B schematically depicts embodiments of the first lighting device 100 and the second lighting device 200. Note that these embodiments or variants may apply to the first lighting device and/or the second lighting device. Hence, the embodiments are indicated with 100,200, etc. In a first variant (I), substantially all light source light, indicated with reference 111,211, respectively is converted by a luminescent material 120 into luminescent material light 121. In a second variant (II), only part of the light source light is converted into luminescent material light 121. For instance, the luminescent material may comprise quantum dots, indicated with reference 20. Light thereof is indicated with reference 121. Hence, quantum dot luminescence may be indicated with the reference 21 and the more general reference 121. Here, by way of example there is a non-zero distance (distance indicated with reference d1) between the light source and the luminescent material 120. The light source is indicated with reference 110,210 respectively. Such light source(s) may independently comprise solid state light sources. References 110,210 especially indicate solid state light sources, such as LEDs or lasers, especially configured to provide one or more of UV and blue radiation, especially at least blue radiation.

Figure 1C:
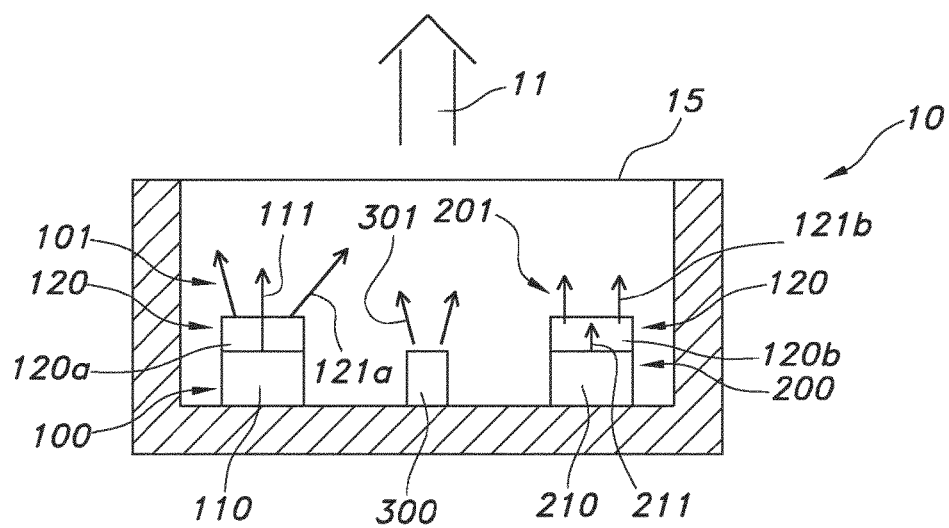

FIG. 1C schematically depicts another embodiment of the lighting unit 10. Here, by way of example, the luminescent material 120 is configured at the light sources 110,120, i.e. in physical contact therewith (i.e. d1=0), such as in a layer on a LED die. Here, by way of example two different luminescent materials 120a, 120b are used. Each of these luminescent materials 120a,120b may independently comprise of a plurality of different luminescent materials. Further, by way of example this embodiment comprises an optional third lighting device 300, also configured to provide white lighting device light, but e.g. having yet another spectral distribution. However, the third lighting device 300 may also be configured to provide colored light 301. The lighting unit light 11 may, dependent upon settings/parameters, comprise one or more of the first lighting device light 101 and the second lighting device light 201 and the optional third lighting device light 301.

Figure 1D:
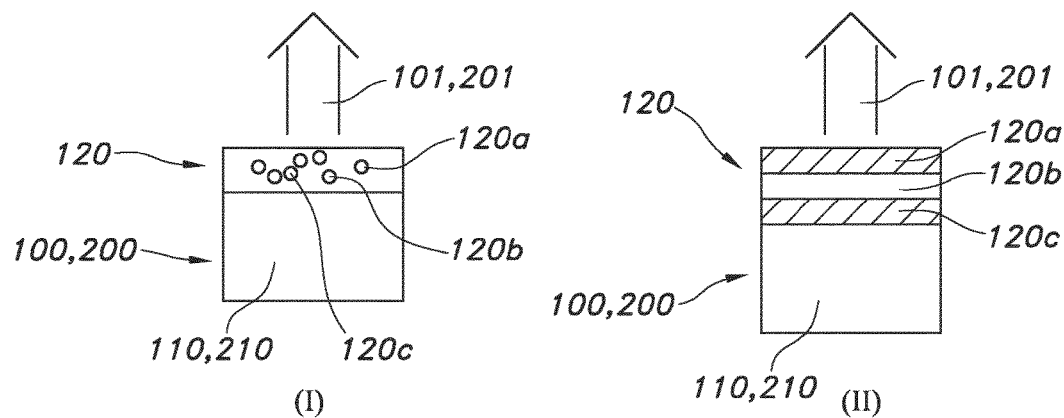

FIG. 1D schematically depict two variants (of the many), wherein light sources 110,210 are used to excite luminescent materials 120 to provide spectral distributions with a plurality of emissions. In a first variant (I) a plurality of different quantum dots can be applied. The different quantum dots can be seen as different luminescent materials, indicated with references 120a, 120b, 120c, etc. etc. Another variant (II) uses layers of luminescent materials 120, indicated with references 120a, 120b, 120c, etc. etc. Of course, combinations of such embodiments may also be applied.

Figure 2:
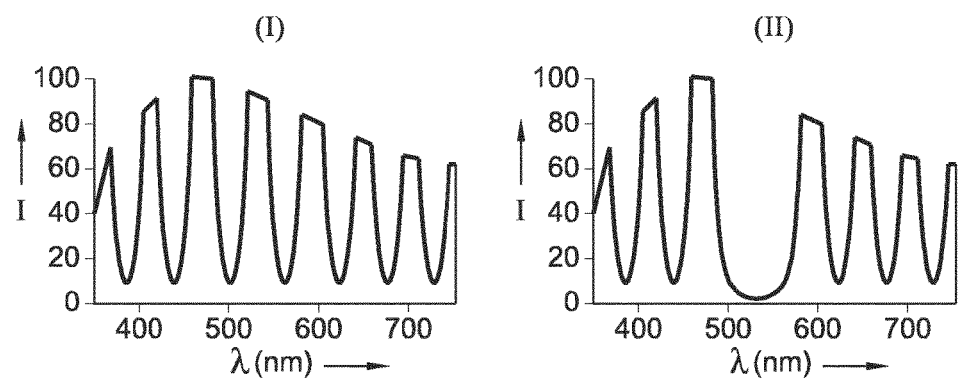
FIG. 2 schematically shows that the perceived light may be different from the light provided.

FIG. 2 shows, by way of example, in the spectrum on the left (I) a schematical spectral distribution of the lighting unit light and in the spectrum on the right (II) the schematical spectral distribution that is perceived by a person after reflection on an item such as a book, a picture, a painting, a product, such as fruit, a carpet, etc. This shows that a variable spectral distribution may be advantageous to tune the contrast (perceived by a user). Hence, with the invention contrast of objects may be enhanced.

In order to achieve a high contrast, in general a peak spectral distribution may be desirable, especially with at least three emission maxima (peaks) separated by at least 50 nm, such as at least 75 nm. At the same time for general lighting applications, such as spot lighting, a full spectrum is desired. For this purpose, it is possible to use a large number of narrow emitters and control these individually in order to obtain the desired spectrum, see FIG. 3. For instance, at the left side, i.e. the first graph in FIG. 3, a spectral distribution of a lighting unit with seven different LEDs may be depicted and the middle (or second) graph a spectral distribution of a lighting unit with six different LEDs may be depicted. The third graph (at the right side) depicts the summed spectral distribution of the previous spectral distributions, i.e. the spectral distribution with the seven and size different LEDs. However, making such a light source is rather complicated and expensive.

Hence, especially it is suggested to use a white light source emitting full spectrum at a given color temperature (CCT) and color rendering index (CRI) and superimpose peaked light emission which has the same color temperature and CRI. By changing the relative intensities of the light sources one can control the degree of color contrast, see FIG. 4. Note that the resulting figure may be one of the results, as the contributions of the different lighting units is tunable by the control unit.

Figure 3:
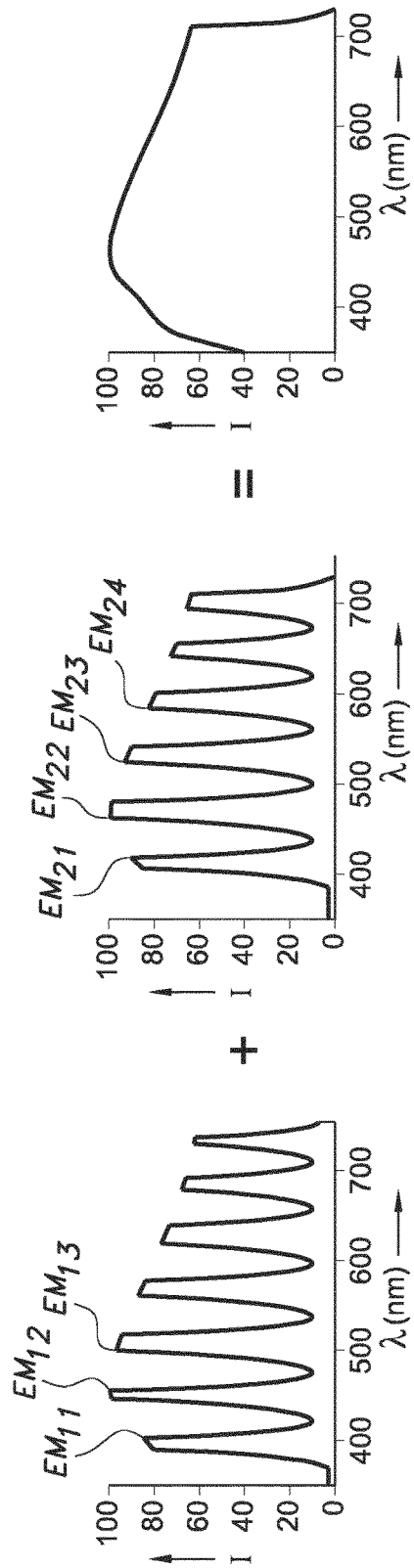
Figure 4:
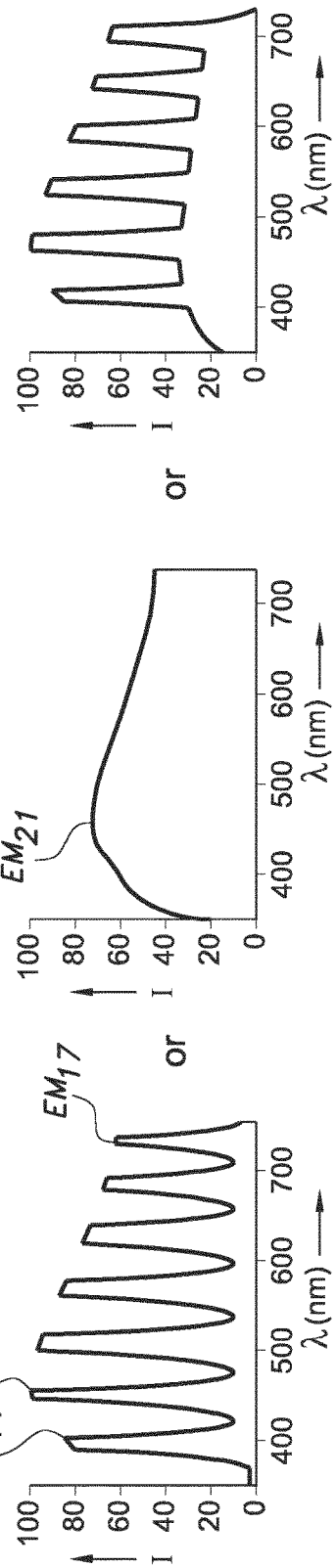

FIGS. 3 and 4 show also the presence of first and second emission maxima. As indicated above, especially the first spectral distribution has a first emission maximum (in the visible), indicated with EM11, especially at least two first emission maxima (EM1, EM2, etc. Further, the second spectral distribution has especially at least two second emission maxima, indicated with references EM21, EM22, etc., especially at least three (EM21, EM22, EM23), such as at least four second emission maxima (EM21, EM22, EM23, EM24). The at least three, or at least four emission maxima all mutually differ especially at least 10 nm, such as at least 20 nm, even more especially at least 30 nm. Referring to e.g. FIG. 4, the first spectral distribution (depicted in the first graph) counts seven (first) emission maxima. The maxima 1 (EM11), 3 (EM13) and 7 (not indicated with a reference), have mutual distances in nanometers of in the order at least 100 nm. The second spectral distribution (middle graph) in FIG. 4 with second emission maximum EM21 is a substantially continuous spectral distribution, for instance for a high color temperature application. Note that for lower color temperature applications, the emission maximum EM21 may be chosen much more to the lower wavelength. Would e.g. the maximum (virtually) be at a longer wavelength than 780 nm, then 780 nm may be defined as the (single) maximum.

For determining the difference between (the emission maxima between the) two spectral distributions, the emission maxima of the first spectral distribution and of the second spectral distribution are defined and subsequently two or more sets of emission maxima are defined wherein in each set an emission maximum of the first spectral distribution and of the second spectral distribution is chosen which out of all available maxima have the smallest distance in nanometers. For instance, assume the following three emission maxima of a first spectral distribution and four emission maxima of a second spectral distribution:

| | | First spectral distribution emission maxima | | |
|---|---|---|---|---|
| | | 470 nm | 500 nm | 610 nm |
| Second spectral distribution emission maxima | 450 nm | x | x | |
| | 550 nm | | x | |
| | 600 nm | | x | |
| | 610 nm | | | x |

Then five sets or combinations (indicated in the table with "x") may be defined, with 450 nm and 470 nm being closest to each other, with 500 nm being identically close to 450 nm and 550 nm, and with the set or combination of identical wavelengths at 610 nm. The maximum of 610 nm of the first spectral distribution of course forms a set with the 610 nm of the second spectral distribution. The 600 nm emission maximum of the second spectral distribution will form a set or combination also with the 610 nm emission maximum of the first spectral distribution. At least three of the four sets differ at least 10 nm from each other, here even about 20 nm. Hence, also emission maxima may substantially overlap, but especially at least two sets of maxima have emission maxima that mutually differ with at least 10 nm, especially at least 15 nm, such as at least 20 nm. Especially, at least two sets can be defined with emission maxima differing at least about 15 nm. Alternatively or additionally, the difference of the spectral distributions can be defined by the number of emission maxima, and/or the FWHM's, and/or the spectral overlap indicated by O. Note that in the example indicated in the table all emission maxima differ by at least 10 nm, except for the 610 nm emission maxima which are identical.

Some further configurations are described here below such as quantum dot LEDs which are also highly suitable for suggested light emitting device.

Figure 5:
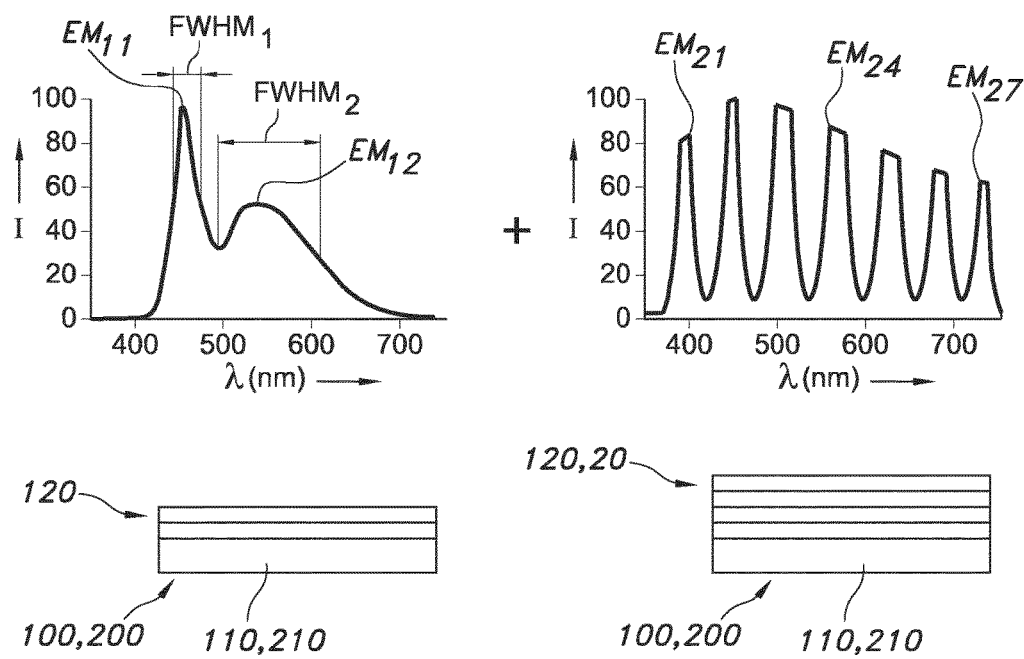

In an embodiment, as schematically depicted in FIG. 5, the luminescent material 120 or quantum dots 20 can be directly positioned on top of the LED. In FIG. 5 FWHM indicates the full width half maximum of the blue band, here LED emission, which is in the order of about 30 nm, such as in the range of 30 nm to 50 nm, and FWHM2 indicates the full width half maximum of e.g. the cerium comprising garnet luminescence which is in the order of about at least 75 nm, such as about 100 nm. The FWHMs of the emission in the right spectrum are substantially smaller than of $Ce^{3+}$ in the spectrum shown in the graph at the left side. The different layers 120 may schematically indicate that different luminescent materials may be provided.

Figure 6:
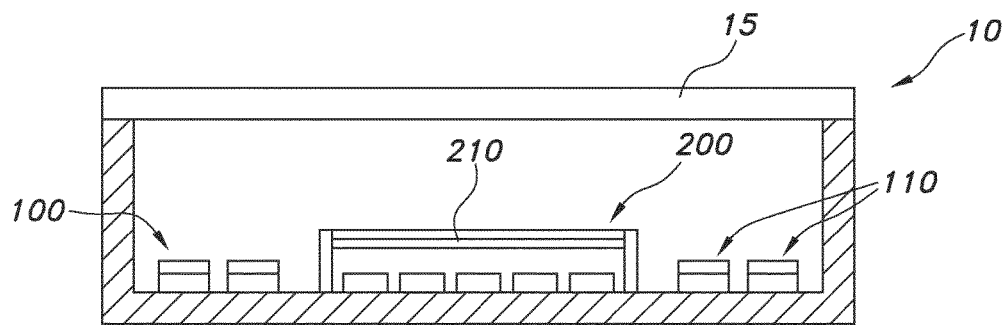

The luminescent material 120 or quantum dots 20 can also be positioned in the vicinity or remote configuration, as shown in FIG. 6. In this configuration the light of the first lighting device and the light of the second lighting device are mixed in a later stage to prevent re-absorption.

Figure 7:
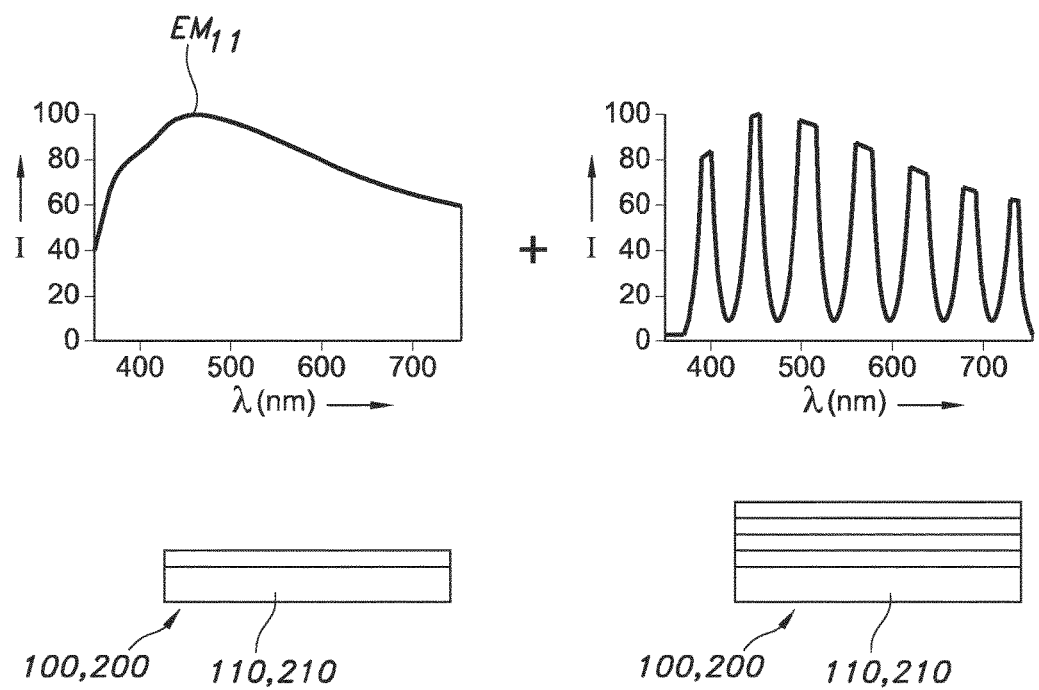

In an embodiment, as schematically depicted in FIG. 7, the first lighting device is a quantum dot LED comprising a mixture of quantum dots providing a continuous spectrum with an emission maximum EM11, and the at least second lighting device is a quantum dot LED comprising a mixture of quantum dots providing a peaked spectrum.

In yet another embodiment, as shown in FIG. 8, the at least first lighting device is a quantum dot LED comprising a mixture of quantum dots providing a first peaked spectrum, and the at least second lighting device is a quantum dot LED comprising a mixture of quantum dots providing a second peaked spectrum, wherein the first and second peaked spectrum do not substantially overlap and provide together a continuous spectrum. E.g. solid state light sources with layers with different types of QDs may be applied.

In yet another embodiment, as shown in FIG. 9, the at least first lighting device is a quantum dot LED comprising a mixture of quantum dots providing a first peaked spectrum, and the at least second lighting device is a quantum dot LED comprising a mixture of quantum dots providing a second peaked spectrum, wherein the first and second peaked spectrum do not substantially overlap but still provide together a peaked spectrum with broader peaks. E.g. solid state light sources with layers with different types of QDs may be applied.

Figure 10:
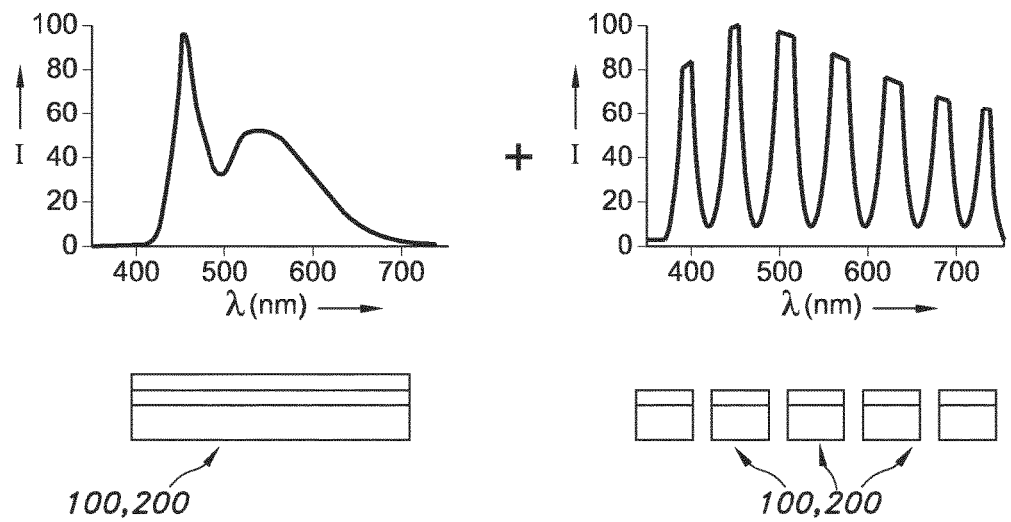

In yet another embodiment, as shown in FIG. 10, the at least first lighting device is a luminescent material converted light source using broad band luminescent materials, and the light emitting device also comprises a plurality of blue (or UV or violet) LEDs comprising each a different quantum dots providing a peaked spectrum. Possible configurations of the lighting devices 100,200 are indicated below the spectra.

Figure 11:
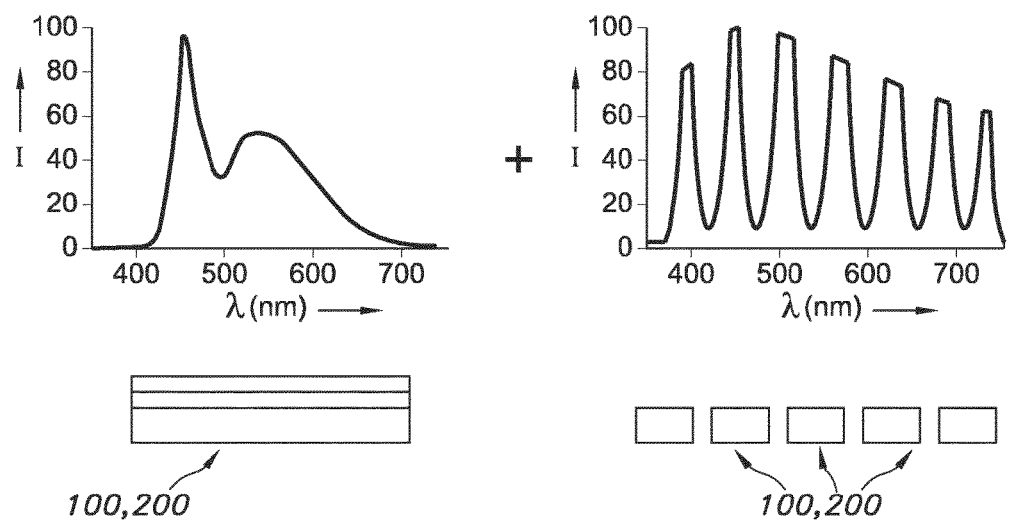

In yet another embodiment, as shown in FIG. 11, the at least first lighting device is a luminescent material converted light source using broad band luminescent materials, and the light emitting device also comprises a plurality of direct emitting LEDs providing a peaked spectrum.

Note that the references 100,200 for the schematically depicted devices in FIGS. 5, 7-11 especially indicate that one of the devices (or combinations of light sources/devices) may be indicated as first lighting device and that the other of the devices (or combinations of light sources/devices) may then be indicated as second lighting device.

Figure 12:
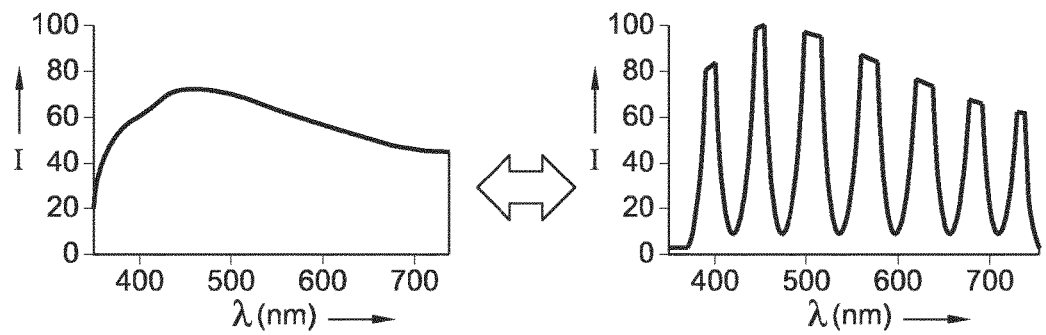

Hence, in an embodiment as shown in FIG. 12 e.g. in a first interval the light emitting device to provide a continuous spectrum (graph on the left side) and in a second interval the light emitting device comprises a peaked spectrum (graph on the right side).

Figure 13:
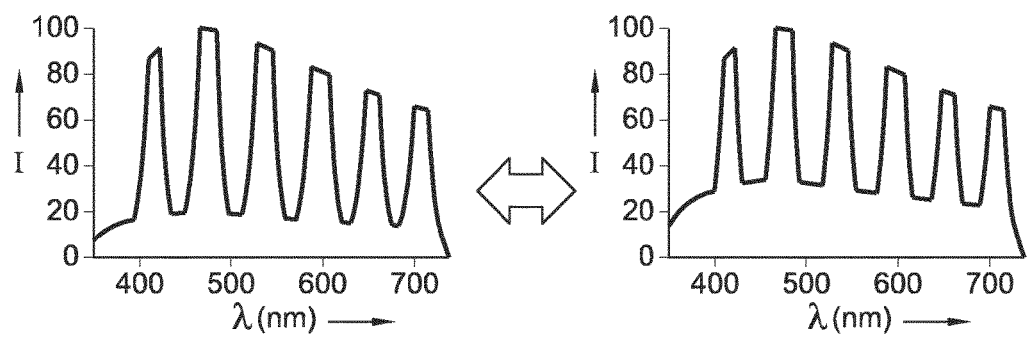

However, alternatively or additionally, in an embodiment as shown in FIG. 13 e.g. in a first interval the light emitting device provides a continuous spectrum superimpose by a first peaked spectrum and in a second interval the light emitting device provides a continuous spectrum superimpose by a second peaked spectrum wherein the depth of the peaks are different.

Figure 14:
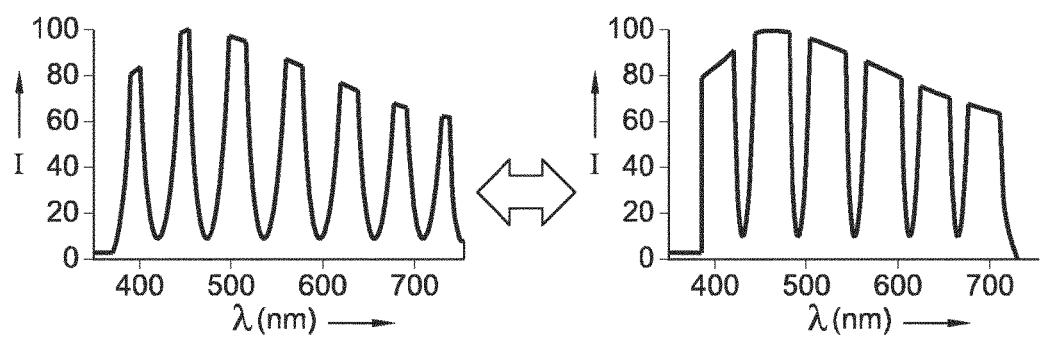

Yet alternatively or additionally, in an embodiment as shown in FIG. 14 e.g. in a first interval the light emitting device comprises a peaked spectrum and in a second interval the light emitting device comprises a peaked spectrum wherein the peak width is changed between the peaked spectra.

When using the lighting unit, the lighting unit may e.g. provide only first lighting device light or only second lighting device light, or both first lighting device light and second lighting device light. The control unit is especially used to control the intensities of the first lighting device light and the second lighting device light. Hence, white light with different color contrast may be provided in dependence of the intensities of the first lighting device light and the second lighting device light.

Figure 15A:
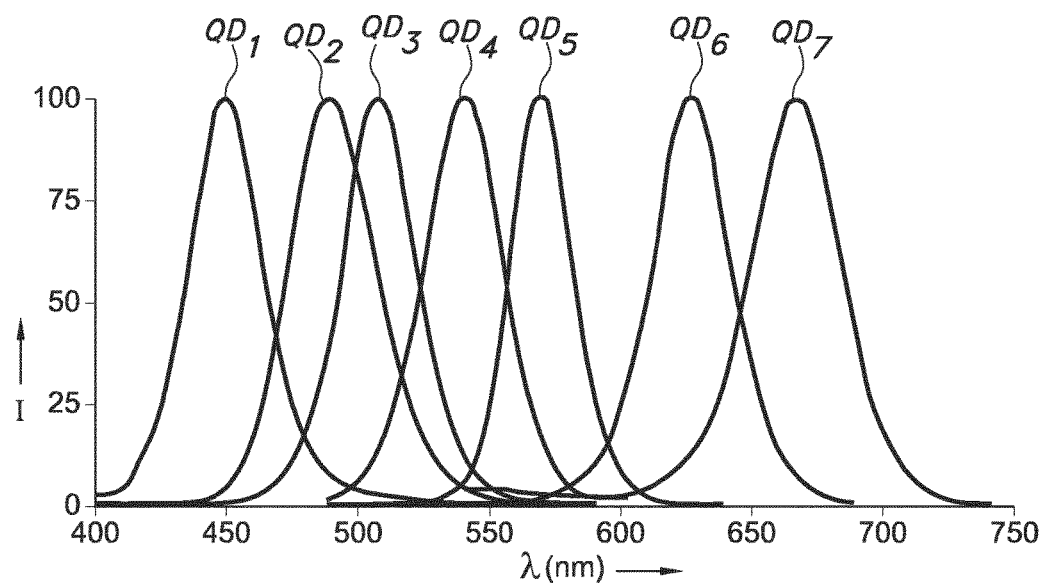
Figure 15B:
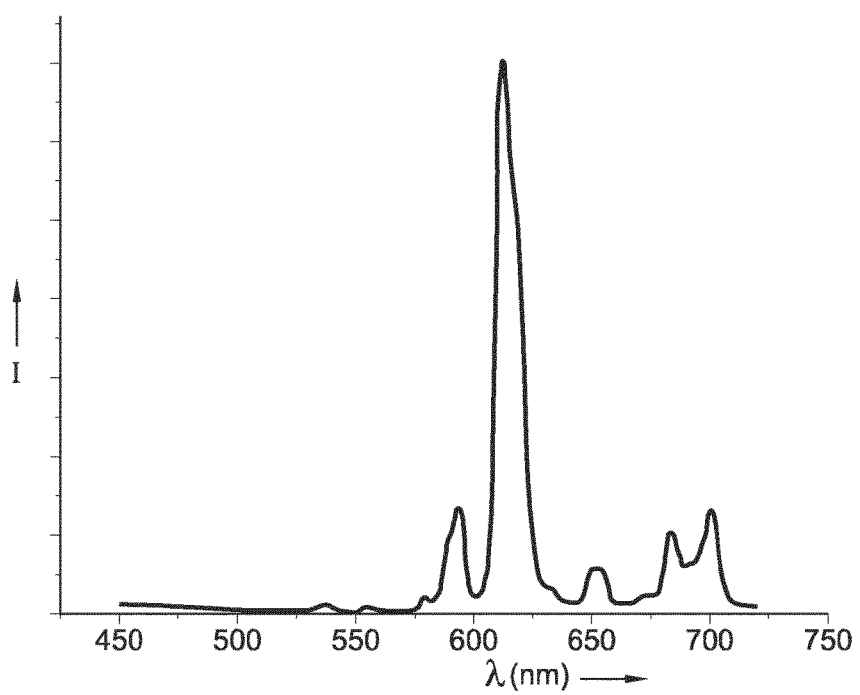

FIG. 15*a* shows a composition of seven different quantum dot emissions, here full width half maximums are in the order of 20-40 nm. FIG. 15*b* shows $Eu^{3+}$ emission, which consists of line. Here, some of the lines are even not resolved and include more than one electronic transition.

When using luminescent material, e.g. the luminescent materials may be selected from the group consisting of organic luminescent materials and inorganic luminescent materials. Non-exclusive examples of narrow line emitters are lanthanide complexes such as $Eu_2(dbt)_3.4H_2O$ (a luminescent dinuclear Eu(III) complex based on 2,8-bis(4',4',4',-trifluoro-1',3'-dioxobutyl)-dibenzothiophene), or other luminescent lanthanide complexes containing e.g. one or more of terbium(III), dysprosium(III), europium(III) and samarium (III), respectively. Also quantum dots may be used. Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with a shell such as cadmium sulfide (CdS) and zinc sulfide (ZnS). Cadmium free quantum dots such as indium phosphide (InP), and copper indium sulfide (CuInS2) and/or silver indium sulfide (AgInS2) can also be used. Quantum dots show very narrow emission band and thus they show saturated colors. Furthermore the emission color can easily be tuned by adapting the size of the quantum dots. Any type of quantum dot known in the art may be used in the present invention. However, it may be preferred for reasons of environmental safety and concern to use cadmium-free quantum dots or at least quantum dots having very low cadmium content.

The light source may especially be a solid state light emitter. Examples of solid state light emitters are Light Emitting Diodes (LEDs), Organic Light Emitting diode(s) OLEDs, or, for example, laser diodes. Solid state light emitters are relatively cost effect light sources because they are, in general, not expensive, have a relatively large efficiency and a long life-time. The light source is preferably a UV, Violet or Blue light source.

Applications include but are not limited to projectors, lamps, luminaires, or other lighting systems such as shop lighting systems, home lighting systems, accent lighting systems, spot lighting systems, theater lighting systems, fiber-optics application systems, projection systems, display systems, warning sign systems, medical lighting application systems, indicator sign systems, and decorative lighting systems, portable systems and automotive applications.

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

The invention claimed is:

1. A lighting unit comprising a first lighting device, a second lighting device, and a control unit configured to control the first and second lighting devices, wherein:
    the first lighting device is configured to provide first lighting device light having a first spectral distribution with at least a first emission maximum, a first color point (x1, y1), and a first correlated color temperature T1;
    the second lighting device is configured to provide second lighting device light having a second spectral distribution with at least two emission maxima spaced by at least 75 nm, a second color point (x2, y2), and a second correlated color temperature T2;
    the lighting unit is configured to generate lighting unit light comprising one or more of the first lighting device light and the second lighting device light;
    the first spectral distribution and the second spectral distribution are different with the emission maxima mutually differing at least 10 nm from each other, and wherein one or more of (i) $0.9 \leq x1/x2 \leq 1.1$, (ii) $0.9 \leq y1/y2 \leq 1.1$, and (iii) $0.9 \leq T1/T2 \leq 1.1$ applies; and
    wherein one or more of the first and second lighting devices comprise one or more of luminescent quantum dots, line emitters, and band emitters, wherein the one or more line emitters are selected from the group consisting of luminescent materials comprising one or more selected from the group consisting of $Pr^{3+}$, $Sm^{3+}$, $Eu^{3+}$, $Tb^{3+}$, $Dy^{3+}$, $Ho^{3+}$, and $Tm^{3+}$, and wherein the one or more band emitters are selected from the group consisting of luminescent materials comprising one or more selected from the group consisting of $Eu^{2+}$, $Ce^{3+}$ and quantum dots.

2. The lighting unit according to claim 1, wherein at least one of the first and second lighting devices is configured to provide a respective one of the first and second lighting device light having a spectral distribution with one or more emission bands having a full width half maximum of at least 15 nm.

3. The lighting unit according to claim 1, wherein at least one of the first and second lighting devices is configured to provide a respective one of the first and second lighting device light having a spectral distribution with three or more emission bands having a full width half maximum of at least 20 nm and at maximum 50 nm.

4. The lighting unit according to claim 1, wherein at least one of the first and second lighting devices is configured to provide a respective one of the first and second lighting device light having a spectral distribution with at least three emission maxima spaced by at least 75 nm.

5. The lighting unit according to claim 1, further comprising a sensor, wherein the control unit is configured to control the lighting devices as function of a sensor signal of the sensor, and wherein the lighting unit further comprises a user interface, wherein the control unit is configured to control an intensity of one or more of the first lighting device light and second lighting device light in dependence of an input parameter provided by the user interface.

6. The lighting unit according to claim 1, wherein at least one of the first and second lighting devices is configured to provide a respective one of the first and second lighting device light having a spectral distribution with one or more emission bands having a full width half maximum of at least 100 nm.

7. The lighting unit according to claim 6, wherein one of the first and second lighting devices is configured to provide a respective one of the first and second lighting device light having a spectral distribution with one or more emission bands having a full width half maximum of at least 100 nm and wherein the other one of the first and second lighting devices is configured to provide a respective other one of the first and second lighting device light having a spectral distribution with at least three emission maxima spaced by at least 75 nm.

8. The lighting unit according to claim 1, wherein one of the first and second lighting devices is configured to provide a respective one of the first and second lighting device light having a spectral distribution with three or less emission maxima and wherein the other one of the first and second lighting devices is configured to provide a respective other one of the first and second lighting device light having a spectral distribution with at least four emission maxima spaced by at least 75 nm.

9. The lighting unit according to claim 1, wherein the first spectral distribution and the second spectral distribution have a spectral overlap equal to or smaller than 50%.

10. The lighting unit according to claim 1, wherein one or more of (i) $0.95 \leq x1/x2 \leq 1.05$, (ii) $0.95 \leq y1/y2 \leq 1.05$, and (iii) $0.95 \leq T1/T2 \leq 1.05$ applies, and wherein:
    the first lighting device comprises (i) a first solid state light source configured to provide first solid state light source radiation and (ii) a first luminescent material configured to convert at least part of the first solid state light source radiation into first luminescent material light, wherein the first lighting device light comprises said first luminescent material light or said first luminescent material light and said first solid state light source radiation; and
    the second lighting device comprises (i) a second solid state light source configured to provide second solid state light source radiation and (ii) a second luminescent material configured to convert at least part of the second solid state light source radiation into second luminescent material light, wherein the second lighting device light comprises said second luminescent material light or said second luminescent material light and said second solid state light source radiation.

11. The lighting unit according to claim 1, wherein the first lighting device is configured to provide first lighting device light having a first color rendering index CRI1 and wherein the second lighting device is configured to provide second lighting device light having a second color rendering index CRI2, wherein $0.8 \leq CRI1/CRI2 \leq 1.2$ applies.

12. The lighting unit according to claim 1, wherein the first spectral distribution has at least two first emission maxima spaced by at least 75 nm, wherein the second spectral distribution has at least two emission maxima spaced by at least 75 nm, with at least two first emission maxima and at least two second emission maxima all mutually differing at least 10 nm from each other.

13. A method of controlling color contrast provided by lighting unit light from the lighting unit according to claim 1, wherein the method comprises controlling the intensity of the first lighting device light and second lighting device light.

14. A method for using the lighting unit according to claim 1, the method comprising illuminating output light of the lighting unit with enhanced color contrast, for graphical industry lighting, for printing industry lighting, for operating room lighting, or for educational lighting.

* * * * *